US011895901B2

(12) United States Patent
Wang

(10) Patent No.: US 11,895,901 B2
(45) Date of Patent: Feb. 6, 2024

(54) ORGANIC LIGHT EMITTING DIODE DISPLAY DEVICE

(71) Applicant: Wuhan China Star Optoelectronics Semiconductor Display Technology Co., Ltd., Wuhan (CN)

(72) Inventor: Kan Wang, Wuhan (CN)

(73) Assignee: Wuhan China Star Optoelectronics Semiconductor Display Technology Co., Ltd, Wuhan (CN)

( * ) Notice: Subject to any disclaimer, the term of this patent is extended or adjusted under 35 U.S.C. 154(b) by 887 days.

(21) Appl. No.: 16/496,957

(22) PCT Filed: Sep. 5, 2019

(86) PCT No.: PCT/CN2019/104471
§ 371 (c)(1),
(2) Date: Sep. 24, 2019

(87) PCT Pub. No.: WO2020/258514
PCT Pub. Date: Dec. 30, 2020

(65) Prior Publication Data
US 2023/0200187 A1    Jun. 22, 2023

(30) Foreign Application Priority Data
Jun. 27, 2019 (CN) .......................... 201910565040.3

(51) Int. Cl.
*H10K 59/80* (2023.01)
*H10K 102/00* (2023.01)

(52) U.S. Cl.
CPC ..... *H10K 59/873* (2023.02); *H10K 2102/311* (2023.02)

(58) Field of Classification Search
CPC ....................... H10K 59/873; H10K 2102/311
See application file for complete search history.

(56) References Cited

U.S. PATENT DOCUMENTS

2015/0137102 A1  5/2015  Yang
2016/0276626 A1  9/2016  Andou
(Continued)

FOREIGN PATENT DOCUMENTS

CN   206282861   6/2017
CN   106997930   8/2017
(Continued)

OTHER PUBLICATIONS

Computer-generated English-language translation of CN-106997930-A.*

*Primary Examiner* — Vu A Nguyen
(74) *Attorney, Agent, or Firm* — PV IP PC; Wei Te Chung; Zhigang Ma

(57) ABSTRACT

An organic light emitting diode display device includes a substrate, a light emitting region disposed on the substrate, a packaging layer covering the light emitting region, and a protective component. The substrate includes a folded region in a first direction and a non-folded region in a second direction, and the first direction is perpendicular to the second direction. The protective component is disposed in the folded region in the first direction and the unfolded region in the second direction. The protective component reduces cracking at a packaging layer and improves bending durability of the organic light emitting diode display device.

16 Claims, 2 Drawing Sheets

(56) References Cited

U.S. PATENT DOCUMENTS

2019/0165076 A1  5/2019  Lee et al.
2020/0227510 A1  7/2020  Choi et al.

FOREIGN PATENT DOCUMENTS

| CN | 106997930 A | * | 8/2017 | ......... H01L 51/5253 |
|----|-------------|---|--------|------------------------|
| CN | 107768540   |   | 3/2018 |                        |
| CN | 107910450   |   | 4/2018 |                        |
| CN | 108550617   |   | 9/2018 |                        |
| CN | 108598287   |   | 9/2018 |                        |
| CN | 108777266   |   | 11/2018|                        |
| CN | 109841656   |   | 6/2019 |                        |
| JP | 2017-126529 |   | 7/2017 |                        |

* cited by examiner

ORGANIC LIGHT EMITTING DIODE DISPLAY DEVICE

RELATED APPLICATIONS

This application is a National Phase of PCT Patent Application No. PCT/CN2019/104471 having International filing date of Sep. 5, 2019, which claims the benefit of priority of Chinese Provisional Patent Application No. 201910565040.3 filed on Jun. 27, 2019. The contents of the above applications are all incorporated by reference as if fully set forth herein in their entirety.

FIELD AND BACKGROUND OF THE INVENTION

The present invention relates to a field of display technology, and more particularly to an organic light emitting diode display device including a protective component.

An edge of an organic light emitting diode display device generates small cracks due to cutting and rubbing during manufacture of the organic light emitting diode display device. When the organic light emitting diode display device is bent, these small cracks tend to expand toward inside of the device. If the cracks extend to the packaging layer, packaging failure may be occurred. Thus, reliability of the organic light emitting diode display devices is reduced.

SUMMARY OF THE INVENTION

An edge of the organic light emitting diode display devices generates small cracks due to cutting and rubbing during manufacturing organic light emitting diode display devices. These small cracks tend to expand toward inside of the devices. If the cracks extend to the packaging layer, the packaging failure may be occurred. Thus, reliability of the organic light emitting diode display devices is reduced. Therefore, an organic light emitting diode display device is provided to solve the problems.

An organic light emitting diode display device includes a substrate, a light emitting region disposed on the substrate, a packaging layer covering the light emitting region, and a protective component. The substrate includes a folded region in a first direction and a non-folded region in a second direction, and the first direction is perpendicular to the second direction. The protective component is disposed in the folded region in the first direction and the unfolded region in the second direction.

In one embodiment, the protective component surrounds the packaging layer and the light emitting region.

In one embodiment, the protective component has a first width in the first direction and the protective component has a second width in the second direction, and the first width is greater than the second width.

In one embodiment, the protective component is a composite structure, and the composite structure is consisted of a plurality of protective component units.

In one embodiment, the plurality of protective component units are disposed in parallel with each other.

In one embodiment, the plurality of protective component units is strip shape.

In one embodiment, a distance between the substrate and the protective component is less than the first width of the protective component in the first direction.

In one embodiment, a distance between the substrate and the protective component is equal or less than the second width of the protective component in the second direction.

In one embodiment, the plurality of protective component units are disposed at equal distances from each other.

In one embodiment, the organic light emitting diode display device is foldable in the folded region in the first direction, and the organic light emitting diode display device is unfoldable in the non-folded region in the second direction.

An organic light emitting diode display device includes a substrate, a light emitting region disposed on the substrate, a packaging layer covering the light emitting region, and a protective component. The substrate includes a folded region in a first direction and a non-folded region in a second direction, and the first direction is perpendicular to the second direction. The protective component is disposed in the folded region in the first direction and the unfolded region in the second direction. The protective component surrounds the packaging layer and the light emitting region. The protective component has a first width in the first direction and the protective component has a second width in the second direction, and the first width is greater than the second width.

In one embodiment, the protective component is a composite structure, and the composite structure is consisted of a plurality of protective component units.

In one embodiment, the plurality of protective component units are disposed in parallel with each other.

In one embodiment, the plurality of protective component units is strip shape.

In one embodiment, a distance between the substrate and the protective component is less than the first width of the protective component in the first direction.

In one embodiment, a distance between the substrate and the protective component is equal or less than the second width of the protective component in the second direction.

In one embodiment, the plurality of protective component units are disposed at equal distances from each other.

In one embodiment, the organic light emitting diode display device is foldable in the folded region in the first direction, and the organic light emitting diode display device is unfoldable in the non-folded region in the second direction.

In the embodiments, the organic light emitting diode display devices include a protective component, and the protective component reduces cracking at the packaging layer and improves bending durability of the organic light emitting diode display devices.

BRIEF DESCRIPTION OF THE SEVERAL VIEWS OF THE INVENTIONS

DESCRIPTION OF SPECIFIC EMBODIMENTS OF THE INVENTION

Figure 1:
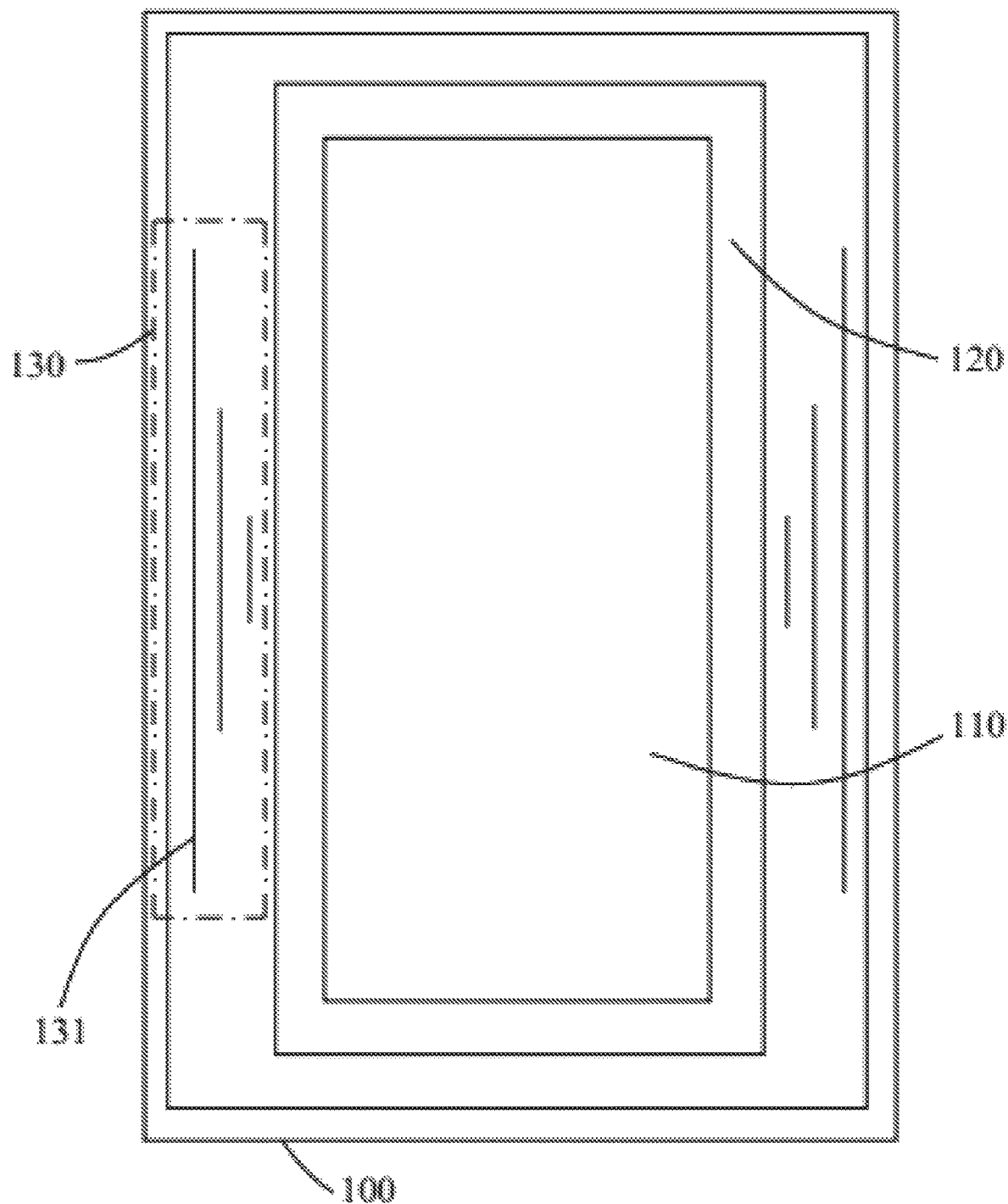
FIG. 1 is a schematic view of an organic light emitting diode display device according to a first embodiment of the present invention.

Referring to FIG. 1, an organic light emitting diode display device provided in a first embodiment includes a substrate 100, a light emitting region 110 disposed on the substrate 100, a packaging layer 120 covering the light emitting region 110, and a protective component 130 surrounding the packaging layer 120 and the light emitting region 110. The substrate 100 includes a folded region at in first direction and a non-folded region in a second direction, and the first direction is perpendicular to the second direction. The organic light emitting diode display device is foldable in the folded region in the first direction. The organic light emitting diode display device is unfoldable in the non-folded region in the second direction. The light emitting region 110 includes an organic light emitting functional layer. The protective component 130 is disposed in the folded region in the first direction and the unfolded region in the second direction, and the protective component 130 improves the bending durability of the organic light emitting diode display device.

Specifically, the protective component 130 has a first width in the first direction and the protective component 130 has a second width in the second direction, and the first width is greater than the second width. In addition, a distance between the substrate 100 and the protective component 130 is less than the first width of the protective component 130 in the first direction. A distance between the substrate 100 and the protective component 130 is equal or less than the second width of the protective component 130 in the second direction. Preferably, the protective component 130 is a composite structure, and the composite structure is consisted of a plurality of protective component units 131. The plurality of protective component units 131 are disposed at equal distances from each other. The plurality of protective component units are disposed in parallel with each other. Additionally, the protective component 130 may also be an elastomer, such as a polyurethane elastomer. Preferably, the protective component units 131 include a strip shape, an arc shape, a wave shape, an S-shape, or any combination of the foregoing shapes. More preferably, when the protective component units 131 are wavy shapes, they have a constant width at a wave period time. Still more preferably, when the protective component units 131 are arc shapes, they can reduce stress concentration and effectively reduce cracking at the packaging layer 120, and improve bending durability of the organic light emitting diode display device.

Figure 2:
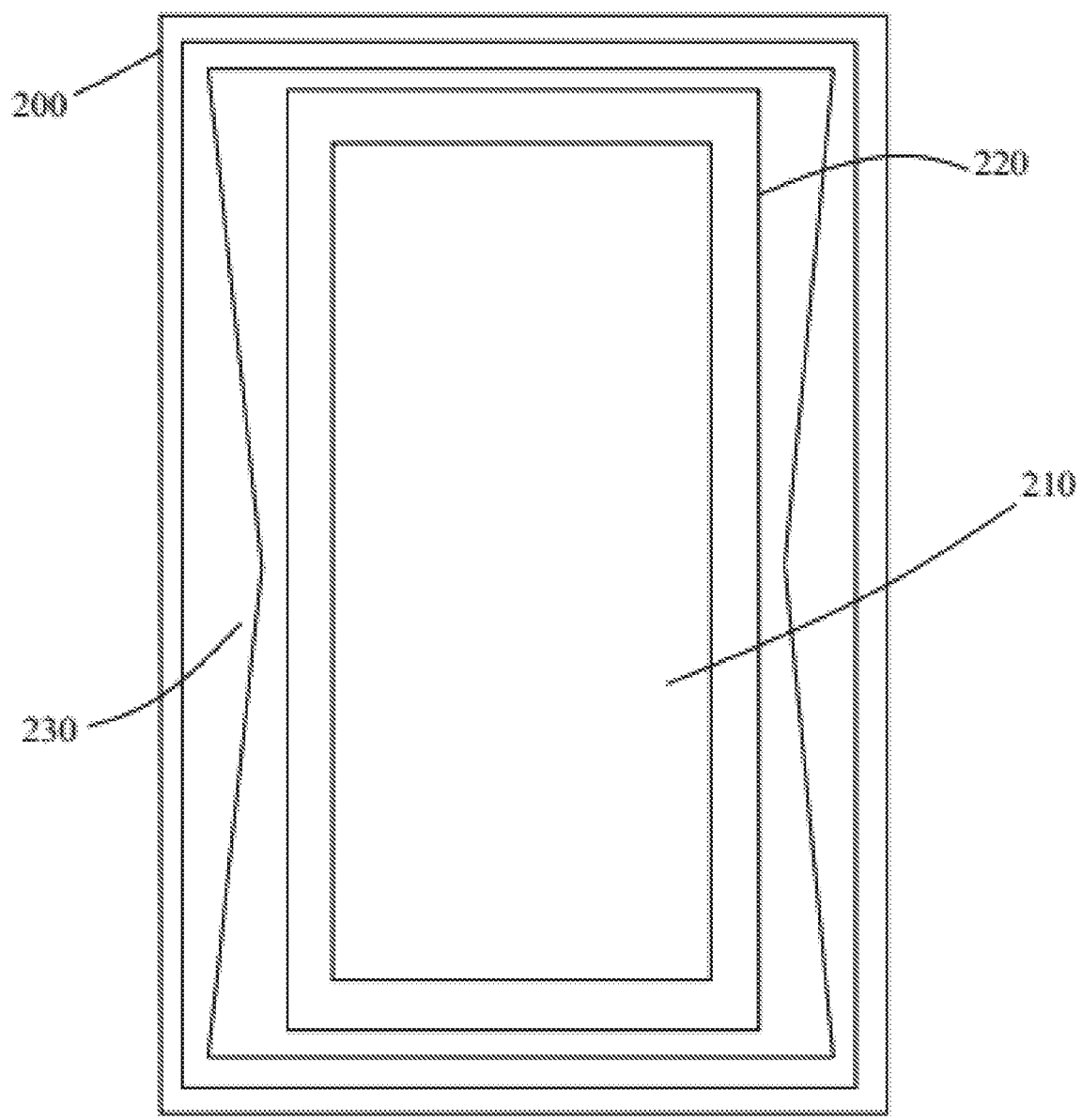
FIG. 2 is a schematic view of a display device of an organic light emitting diode according to a second embodiment of the present invention.

Referring to FIG. 2, an organic light emitting diode display device provided in a second embodiment includes a substrate 200, a light emitting region 210 disposed on the substrate 200, a packaging layer 220 covering the light emitting region 210, and a protective component 230 surrounding the packaging layer 220 and the light emitting region 210. The substrate 200 includes a folded region in a first direction and a non-folded region in a second direction, and the first direction is perpendicular to the second direction. The organic light emitting diode display device is foldable in the folded region in the first direction. The organic light emitting diode display device is unfoldable in the non-folded region in the second direction. The light emitting region 210 includes an organic light emitting functional layer. The protective component 230 is disposed in the folded region in the first direction and the unfolded region in the second direction, and the protective component 230 improves the bending durability of the organic light emitting diode display device. Specifically, the protective component 230 is a unitary structure, and it is not particularly limited and may be appropriately selected as needed. In addition, the protective component 230 may also be an elastomer, such as a polyurethane elastomer. A width of the protective component 230 is gradually reduced from the center to the sides in the second direction. Additionally, the protective component 230 has a first width in the folded region, and the protective component 230 has a second width in the non-folded region, and the first width is greater than the second width. The difference between the first embodiment and the second embodiment is that the protective component 230 is not a composite structure in the second embodiment, and the protective component 230 does include protective component units.

The organic light emitting diode display devices of the first and second embodiments including a protective component reduce cracking at the packaging layer and improve bending durability of the organic light emitting diode display devices.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An organic light emitting diode display device, comprising:
   a substrate, wherein the substrate comprises a folded region in a first direction and a non-folded region in a second direction, wherein the first direction is perpendicular to the second direction;
   a light emitting region disposed on the substrate;
   a packaging layer, wherein the packaging layer covers the light emitting region; and
   a protective component, wherein the protective component is disposed in the folded region in the first direction and the unfolded region in the second direction,
   wherein the protective component has a first width in the first direction and the protective component has a second width in the second direction, wherein the first width is greater than the second width.

2. The organic light emitting diode display device according to claim 1, wherein the protective component is a composite structure, and the composite structure consists of a plurality of protective component units.

3. The organic light emitting diode display device according to claim 2, wherein the plurality of protective component units are disposed in parallel with each other.

4. The organic light emitting diode display device according to claim 2, wherein the plurality of protective component units is strip shaped.

5. The organic light emitting diode display device according to claim 1, wherein a distance between the substrate and the protective component is less than the first width of the protective component in the first direction.

6. The organic light emitting diode display device according to claim 1, wherein a distance between the substrate and the protective component is equal or less than the second width of the protective component in the second direction.

7. The organic light emitting diode display device according to claim 3, wherein the plurality of protective component units are disposed at equal distances from each other.

8. The organic light emitting diode display device according to claim 1, wherein the organic light emitting diode display device is foldable in the folded region in the first direction, and the organic light emitting diode display device is unfoldable in the non-folded region in the second direction.

9. An organic light emitting diode display device, comprising:
   a substrate, wherein the substrate comprises a folded region in a first direction and a non-folded region in a second direction, and the first direction is perpendicular to the second direction;

a light emitting region disposed on the substrate;

a packaging layer, wherein the packaging layer covers the light emitting region; and a protective component, wherein the protective component is disposed in the folded region in the first direction and the unfolded region in the second direction;

wherein the protective component surrounds the packaging layer and the light emitting region; and wherein the protective component has a first width in the first direction and the protective component has a second width in the second direction, and the first width is greater than the second width.

10. The organic light emitting diode display device according to claim 9, wherein the protective component is a composite structure, and the composite structure is consisted of a plurality of protective component units.

11. The organic light emitting diode display device according to claim 10, wherein the plurality of protective component units are disposed in parallel with each other.

12. The organic light emitting diode display device according to claim 11, wherein the plurality of protective component units is strip shape.

13. The organic light emitting diode display device according to claim 9, wherein a distance between the substrate and the protective component is less than the first width of the protective component in the first direction.

14. The organic light emitting diode display device according to claim 9, wherein a distance between the substrate and the protective component is equal or less than the second width of the protective component in the second direction.

15. The organic light emitting diode display device according to claim 10, wherein the plurality of protective component units are disposed at equal distances from each other.

16. The organic light emitting diode display device according to claim 9, wherein the organic light emitting diode display device is foldable in the folded region in the first direction, and the organic light emitting diode display device is unfoldable in the non-folded region in the second direction.

\* \* \* \* \*